United States Patent
Dawson et al.

(10) Patent No.: US 7,177,366 B1
(45) Date of Patent: Feb. 13, 2007

(54) AUTOMATIC PHASE ALIGNMENT FOR HIGH-BANDWIDTH CARTESIAN-FEEDBACK POWER AMPLIFIERS

(75) Inventors: Joel L. Dawson, Woodbridge, VA (US); Thomas H. Lee, Cupertino, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 769 days.

(21) Appl. No.: 09/947,624

(22) Filed: Sep. 6, 2001

(51) Int. Cl.
*H04I 27/00* (2006.01)
(52) U.S. Cl. .................................................. 375/295
(58) Field of Classification Search ................ 375/130, 375/140, 146, 295–298
See application file for complete search history.

(56) References Cited

U.S. PATENT DOCUMENTS

| | | | | |
|---|---|---|---|---|
| 5,732,333 | A * | 3/1998 | Cox et al. | 455/126 |
| 5,900,778 | A * | 5/1999 | Stonick et al. | 330/149 |
| 6,253,066 | B1 * | 6/2001 | Wilhite et al. | 455/108 |
| 6,801,581 | B1 * | 10/2004 | Francos et al. | 375/296 |
| 2001/0016014 | A1 * | 8/2001 | Nam | 375/285 |

OTHER PUBLICATIONS

Mats Johansson, *Linearization of RF Power Amplifiers Using Cartesian Feedback*; Lund University, Department of Applied Electronics, Nov. 1991.

M.A. Briffa and M. Faulkner, *Gain and Phase Margins of Cartesian Feedback RF Amplifier Linearisation*, First Mobile and Personal Communication System Workshop, University of South Australia, Nov. 1992.

Y. Ohishi et al., *Cartesian Feedback Amplifier with Soft Landing*, Radio and Satellite Communication Systems Laboratory, Fujitsu Laboratories Ltd., 1992.

Majid Boloorian and Joseph P. McGeehan, *The Frequency-Hopped Cartesian Feedback Linear Transmitter*, IEEE transactions on Vehicular Technology, vol. 45, No. 4, Nov. 1996, manuscript first received on Sep. 20, 1994.

\* cited by examiner

*Primary Examiner*—Kevin Burd
(74) *Attorney, Agent, or Firm*—Crawford Maunu PLLC

(57) ABSTRACT

In an automatic phase alignment circuit for a Cartesian feedback amplifier, the phase error is regularly monitored. In various implementations, this approach is used to provide true and continuous phase alignment. Based on a relationship between the up-converted and down-converted signals, another implementation of the invention provides phase-alignment for quadrature-phase components of a baseband signal by arithmetically combining the quadrature-phase components and the feedback components continuously and, in response, continuously phase-adjusting signals in the feed-forward signal path. Another aspect of the present invention is directed to an approach for calculating phase error for that is caused by DC-offset interference which, in turn, manifest at the outputs of many analog functional blocks.

14 Claims, 4 Drawing Sheets

AUTOMATIC PHASE ALIGNMENT FOR HIGH-BANDWIDTH CARTESIAN-FEEDBACK POWER AMPLIFIERS

FIELD OF THE INVENTION

The present invention relates generally to amplifier circuits for radio frequency (RF) communications. Various aspects of the invention are more particularly related to phase alignment in Cartesian feedback amplifiers.

BACKGROUND

The increasing availability of information in the form of data from various sources has lead to a large public demand for data transfer that challenges the capabilities of existing communication delivery systems. A wide variety of types of information sources are available in the form of discrete devices and systems, as well as tools available over shared sources such as the Internet and private data network sources. The associated end-use applications for such information is also diverse and including industrial, commercial and retail markets, including for example personal computers, full-motion video devices, cellular communication devices, and PDAs. The technological development has grown largely due to expanded used and demand for a greater range of subject matter content and delivery of such content at higher speeds.

Another aspect challenging development of such high-performance devices is the need to reduce power consumption. In connection with portable devices, the cost and limited usage time provided by batteries has led to an ongoing effort to significantly reduce power consumption without compromising size or performance. With more recent concerns regarding power availability, power consumption concerns are no longer limited to portable devices.

Presently there exists a great demand for wireless systems that achieve high data transmission rates while using as little power and bandwidth as possible. Maximum data transfer for a given channel width demands sophisticated modulation techniques, the best of which require a linear power amplifier (PA). The strong tradeoff between linearity and power efficiency in PA's has motivated research into linearization techniques, of which Cartesian feedback is an important and promising example.

The forward path of a typical Cartesian feedback system includes separate gain and filter elements for each Cartesian component (I and Q). Immediately following these elements is a quadrature modulator, whose output in turn drives the power amplifier. Feedback is provided by coupling a signal from the output of the RF amplifier to a quadrature demodulator. In general, it is necessary to provide a phase shift between the local oscillator inputs of the modulator and demodulator.

The adjustment of the phase shift signal ensures synchronous demodulation of the baseband signal. Properly adjusted, the system functions as two decoupled feedback loops: one for the I channel, and one for the Q channel. Feedback stability margins degrade as this adjustment departs from the optimum, and instability can result. The exact phase shift required can drift over time, temperature, and process variations, and usually changes with carrier frequency, which is particularly troublesome for frequency-hopping systems. To allow for linearization at the maximum symbol rate, this phase shift must be regulated as accurately as possible. In addition, rejection of drift with temperature demands continuous regulation. Thus far, these problems have been mitigated to a limited extent using non-exact approximation techniques and relatively complex digital signal processing.

SUMMARY

The present invention is directed to addressing and overcoming the above-mentioned, and other, concerns for a variety of wireless applications including those discussed above. In certain applications, example embodiments of the present invention are directed to regular and/or continuous monitoring for regulation of the local oscillator ("LO") phase alignment. While some applications to which the present invention is directed might often still employ digital signal processing to assist in the "LO" phase alignment, regularly monitoring according to the present invention advantageously eliminates such digital signal processing as a requirement.

Another aspect of the present invention is directed to a particular phase-alignment circuit for quadrature-phase components of a baseband signal. The phase-alignment circuit includes a feed-forward signal path including an up-converting circuit adapted to upconvert the quadrature-phase components, and a feed-back signal path including a down-converting circuit adapted to down-convert the up-converted quadrature-phase components and thereby provide feedback components. A circuit monitors the phase error by arithmetically combining the quadrature-phase components and the feedback components. In response to this monitoring, the circuit automatically provides a phase adjustment signals in the feed-forward path.

A more specific and related implementation provides the phase adjustment by arithmetically combining the quadrature-phase components and the feedback components as a function of the phase error being equal to $I*Q'-Q*I'$, where I and Q are the quadrature-phase components and Q' and I' are the feedback components.

Another aspect of the present invention is directed to continuously monitoring the phase error to permit true and continuous phase alignment. Based on a relationship between the up-converted and down-converted signals, one particular implementation provides phase-alignment for quadrature-phase components of a baseband signal by arithmetically combining the quadrature-phase components and the feedback components continuously and, in response, continuously phase-adjusting signals in the feed-forward path.

Yet another aspect of the present invention is directed to an approach for eliminating phase alignment error that is caused by DC-offset interference. DC-offset interference manifests at the outputs of analog functional blocks. Signal-contaminating artifacts introduced at the outputs of these analog functional blocks are modulated to a frequency which can be readily removed using conventional signal-filter technology.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the detailed description of various embodiments of the invention in connection with the accompanying drawings, in which.

Figure 1:
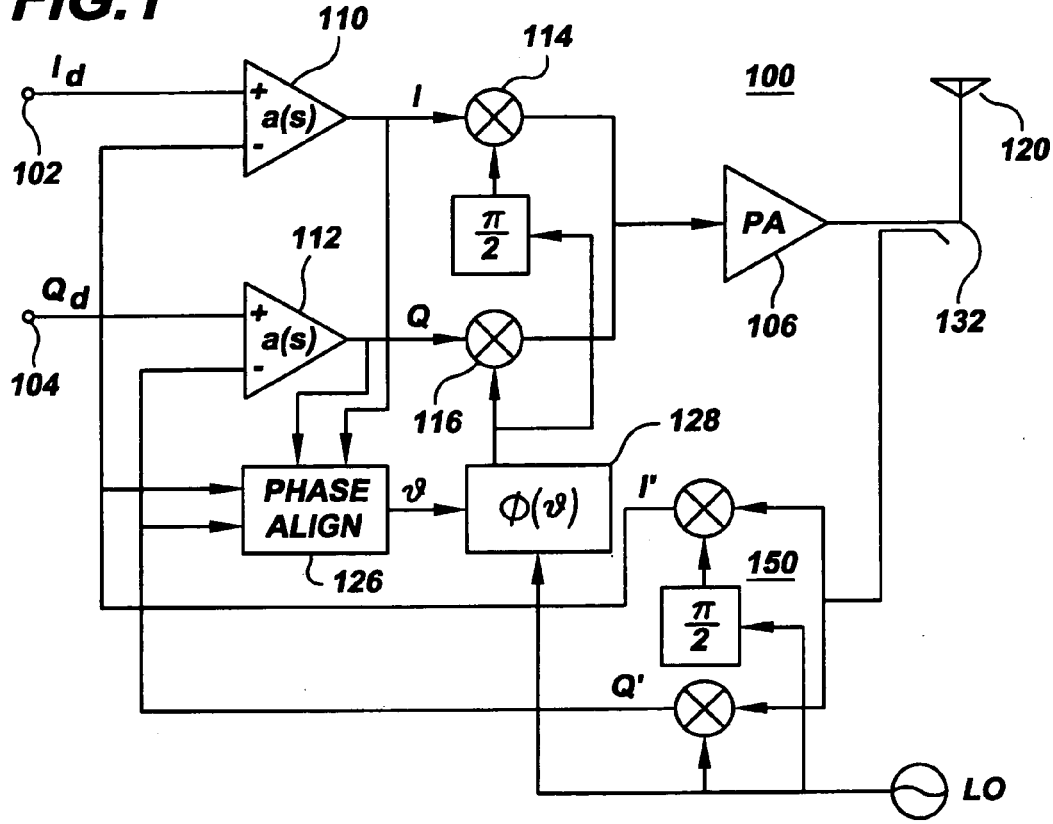
FIG. 1 is a block diagram of a Cartesian feedback system, according to an example embodiment of the present invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of radio frequency (RF) communications devices that amplify and/or filter quadrature-phase components of a baseband signal. The present invention has been found to be particularly suited for devices using Cartesian feedback to linearize an RF power amplifier. While the present invention is not necessarily limited to such devices, various aspects of the invention may be appreciated through a discussion of various examples using this context.

According to an example embodiment of the present invention, a Cartesian feedback circuit includes a phase-alignment circuit that is designed for quadrature-phase components of a baseband signal. The circuit includes a feed-forward signal path, a feed-back signal path and arithmetic circuitry that combines the quadrature-phase components and the feedback components as a function of the phase error being equal to:

$$I^*Q' - Q^*I',$$

where I and Q are the quadrature-phase components and Q' and I' are their down-converted feedback components. According to certain example embodiments of the present invention, this control law is implemented using analog functional blocks; in other example embodiments of the present invention, this control law is realized using digital signal processing.

FIG. 1 shows an example Cartesian feedback system 100, according to the present invention. The system 100 receives baseband input signals in quadrature format, denoted I and Q respectively at nodes 102 and 104, and provides a linearized signal for amplification by power amplifier 106. Input signals I and Q define the beginning of the feed-forward path, which includes amplifier circuits 110 and 112. Optionally following amplifier circuits 110 and 112 are filters (not shown), then respective modulators 114 and 116 for the amplified quadrature signals as provided by the amplifier circuits 110 and 112 or the filters, and then the power amplifier 106 and an output load, e.g., antenna 120.

A phase shifter, including phase-alignment controller 126 and phase adjuster 128, ensures synchronous demodulation of the feedback RF signal. The continuous operation of the controller is important in mitigating the time, temperature, and process variations that can adversely impact the exact phase shift required. In addition, this approach offsets the adverse impact due to changes with carrier frequency, which is particularly troublesome in frequency-hopping systems. To allow for linearization at the maximum symbol rate, the phase shifter of system 100 is regulated as accurately as possible and/or as is practicable for the intended application.

Figure 2:
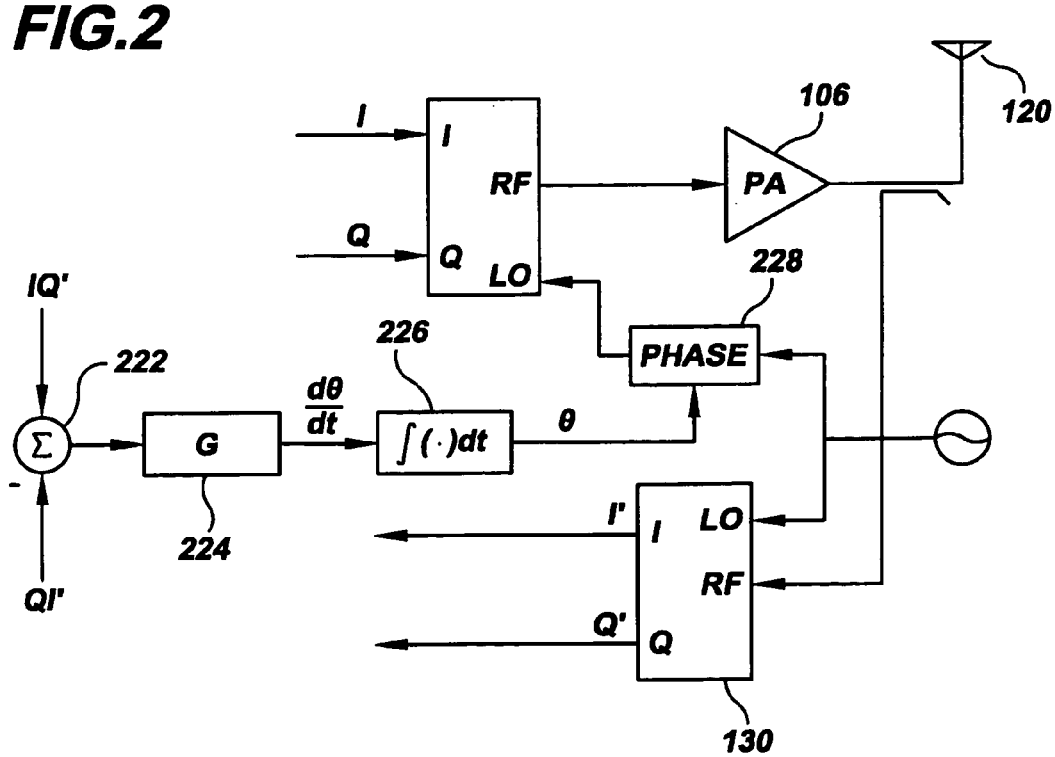
FIG. 2 is another illustration of the block diagram of the system of FIG. 1, also according to the present invention.

In addition, the phase shifter is regularly or continuously monitored to reject frequency drift ensuing from temperature changes. FIG. 2 illustrates a system-level view with details of the nonlinear dynamic controller built around the identity:

$$I^*Q' - Q^*I' = rr' \sin(\theta - \theta'),$$

where I and Q are Cartesian components of the baseband signal, r and θ are the corresponding polar coordinates, and primed ("'") coordinates denote symbols derived from the demodulated power amplifier outputs. I and Q of FIG. 2 correspond to the baseband input signals in quadrature format at nodes 102 and 104 of FIG. 1, and I' and Q' of FIG. 2 correspond to the feedback signals output from the I–Q demodulator 130 of FIG. 1. Mathematically, using the notation Δθ=θ−θ', the circuit of FIG. 2 can be understood as mechanizing the following equation:

$$\frac{d\theta}{dt} = -k[r(t)]^2 G \sin(\Delta\theta),$$

where k is a constant of proportionality and gain G is associated with integrator 226 of FIG. 2.

When considering the angular position of the down-converted demodulated baseband signal S' relative to the angular position of the initially-converted demodulated baseband signal S, the consequences of phase misalignment can be significant. The demodulated symbol S' is rotated relative to S by an amount equal to the LO phase-misalignment difference, φ. Thus, the down-converted Cartesian components are:

$$I' = (I \sin \omega t + Q \cos \omega t)\sin(\omega t + \phi);$$

$$Q' = (I \sin \omega t + Q \cos \omega t)\cos(\omega t + \phi);$$

where ω is the carrier frequency. Using trigonometric identities and assuming frequency components at 2ω have been filtered out, S' is represented as:

$$I' = \frac{1}{2}(I\cos\phi + Q\sin\phi);$$

$$Q' = \frac{1}{2}(-I\sin\phi + Q\cos\phi)$$

Figure 3:
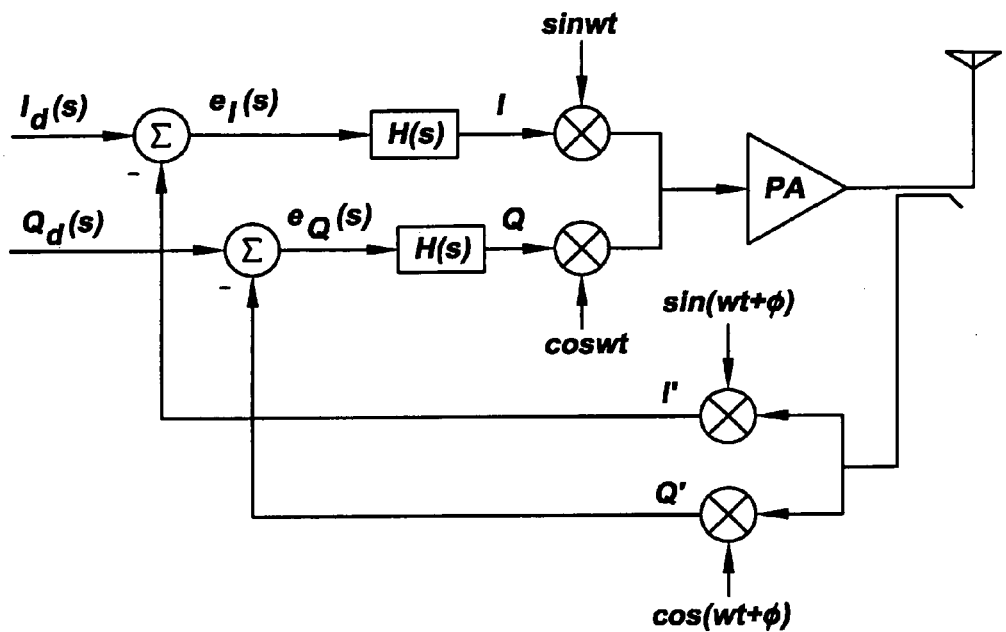
FIG. 3 is a representation of a Cartesian feedback system for illustrating the error signals taken into account by various implementation of the present invention.

Due to the misalignment problem in the conventional Cartesian feedback system, its feedback loops are coupled to one another rather than being truly independent. The nature of this misalignment permits us to evaluate dynamic behavior of the two inter-coupled feedback loops. One method of analysis is to consider error signals $e_I(s)$ and $e_Q(s)$ as shown in FIG. 3. For a signal feedback loop, the error signal can be represented in the frequency domain as follows:

$$e(s) = \frac{X(s)}{1 + L(s)}.$$

In this relationship, L(s) represents the overall dynamics in the loop and X(s) represents the input. For frequencies of interest, it can be assumed that the absolute value of L(s) is very large.

Assuming that the phase misalignment is $\phi$, $Q_d=0$ without loss of generality for linearized analysis. The error expressions, as a function of the single input $I_d(s)$, can be written as:

$$e_I(s) = I_d(s) - L(s)e_I(s)\cos\phi - L(s)e_Q(s)\sin\phi;$$

$$e_Q(s) = L(s)e_I(s)\sin\phi - e_Q(s)L(s)\cos\phi.$$

where L(s) includes the dynamics of the loop compensation scheme (H(s)) and also the (linearized) dynamics introduced by the modulator, power amplifier, and demodulator. The above error expressions can be reduced to the following single-input problem:

$$e_I(s) = \frac{X(s)}{1 + L(s)\cos\phi + \frac{[L(s)\sin\phi]^2}{1 + L(s)\cos\phi}}.$$  Eqtn. 1.

In connection with the present invention, this system reduction has lead to the discovery that the loop dynamics are a cascade of the dynamics in the uncoupled case. In this regard an effective loop transmission, $L_{eff}(s,\phi)$, is represented as follows:

$$L_{eff}(s, \phi) = L(s)\cos\phi + \frac{[L(s)\sin\phi]^2}{1 + L(s)\cos\phi}.$$  Eqtn. 2.

For perfect misalignment, $$\phi = \frac{\pi}{2},$$

for which $L_{eff}=[L(s)]^2$: thus, the loop dynamics are a cascade of the dynamics in the uncoupled case. Unless designed with this possibility in mind, most choices of H(s) will yield unstable behavior in this second case. Equation 2 shows that traditional measures of stability will degrade continuously as $\phi$ sweeps from 0 to $$\frac{\pi}{2}.$$

Also according to the present invention, a control approach for the phase alignment problem is the simplest of nonlinear dynamic feedback systems. Dynamics associated with the phase shifter (and, possibly, the subtractor) complicate the real-world implementations. Considering an ideal but unrealistic modulation scheme in which the magnitude of transmitted symbols is held constant, r(t) in Equation 1 loses its time dependence.

Figure 4:
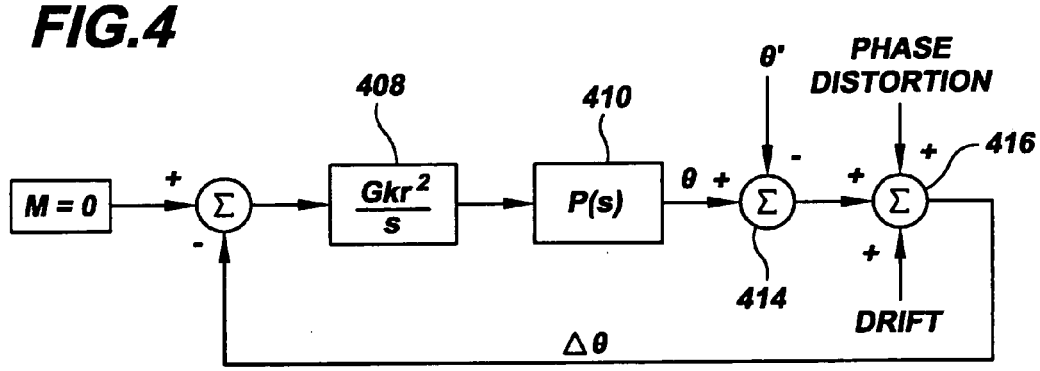
FIG. 4 is a linearized phase regulation system according to the present invention.

By linearizing for small phase misalignments and including the dynamics of the phase shifter as P(s), the system can be represented as shown in FIG. 4. In FIG. 4, the output of the phase shifter 410 is not really $\theta$, but rather an additive part of $\theta$ that gets combined with the polar angle of the symbol being transmitted. However, in the absence of phase distortion and drift, the symbol-by-symbol changes of the polar angle $\theta$ are tracked by identical changes in $\theta'$. These symbol-rate changes are thus invisible to an alignment system, and it is appropriate to label the output of P(s) as $\theta$. The effects of phase distortion and phase alignment drift can be included as the additive disturbances shown in FIG. 4 as vertically-oriented inputs to summers 414 and 416.

One can ensure stability by choosing the gain G (block 224 of FIG. 2) in block 408 such that, for the largest symbol magnitude, loop crossover occurs before non-dominant poles become an issue. Fortunately, as discussed by B. Razavi in RF Microelectronics, Prentice-Hall, Inc., NJ 1998, the drift disturbance normally occurs on the time scales associated with the temperature drift and aging. Because the Cartesian feedback system is designed to suppress the phase distortion, for many systems the design effort need not be largely focused on fast-phase alignment.

Figure 5:
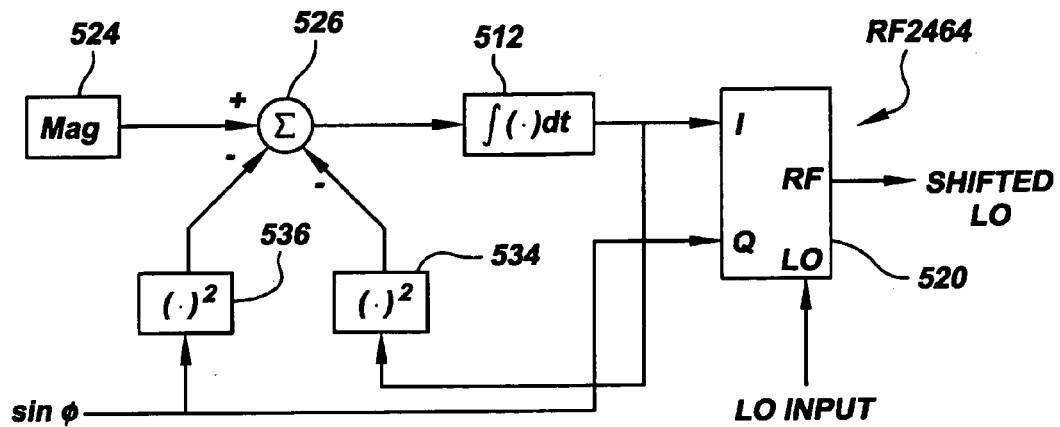
FIG. 5 is an expanded diagram of a phase-adjust circuit, according to the present invention, that can be used with the example embodiment of FIG. 2.
Figure 6:
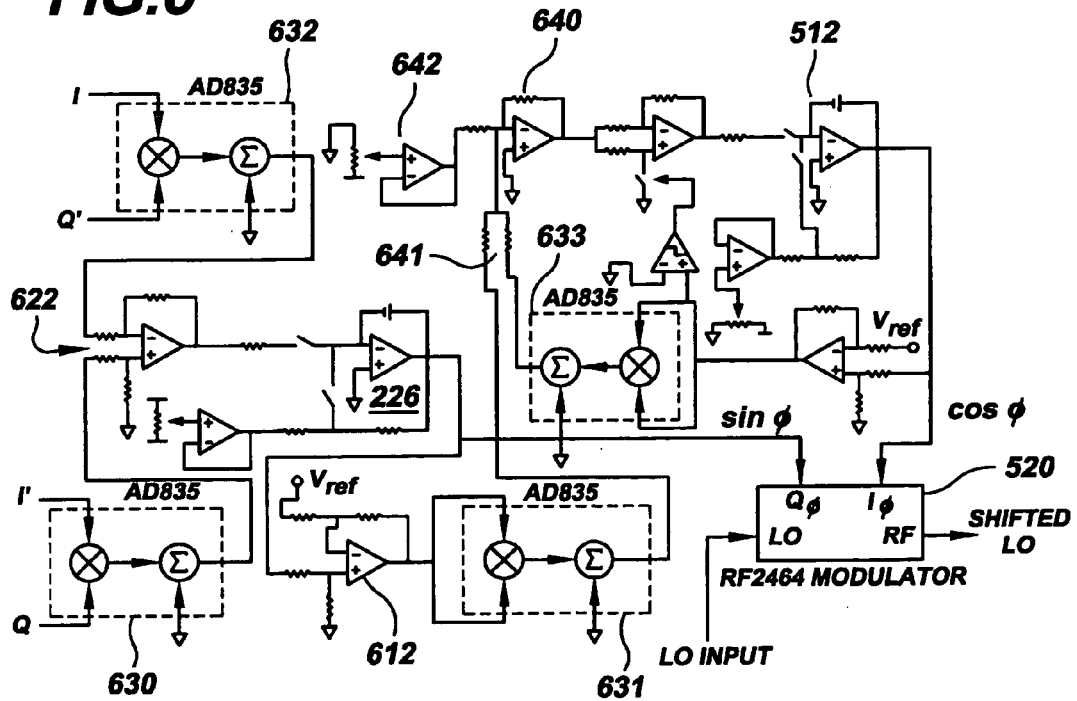
FIG. 6 is an expanded diagram of a controller and a phase-adjust circuit that are consistent with the example embodiment of FIG. 2.

In a more specific embodiment of the present invention, the phase shifter (228 of FIG. 2) and its controller (222, 224 and 226) are exploded in detail as shown respectively in FIGS. 5 and 6. Referring first to FIG. 5, the phase shifter processes the phase shift signal $\phi$ using its sine; thus, a block functioning as 'arcsin(•)' effectively resides between the integrator output 226 and the input port to the phase shifter 228 of FIG. 2. A quadrature modulator 520 receives this modified phase shift signal "sin $\phi$" and an output from an analog control loop at its respective quadrature-signal inputs. The analog control loop includes a forward path and a feedback path. The forward path has a reference circuit ("MAG") 524, a modulator (summer) 526, and an integrator 512 which drives the "Q" input to the modulator 520. The feedback path includes a first analog-signal squaring circuit 534 operating on the output of the integrator 512 and a second analog-signal squaring circuit 536 operating on the modified phase shift signal "sin $\phi$". In this manner, the control loop forces the sum of the squares of input to the modulator 526 to equal the constant ('MAG') as provided by the reference circuit 524, thereby ensuring a constant amplitude for the shifted LO signal that is output by the modulator 520.

To accommodate the above-described approach, the previously-discussed math is slightly changed. For the circuit of FIG. 5, the shifted LO is represented as:

$$I_{LO} \sin \omega t + Q_{LO} \cos \omega t.$$

To within a multiplicative constant, this expression is equal to $$\cos \phi \sin \omega t + \sin \phi \cos \omega t.$$

Using the circuit of FIG. 5, the analog input is therefore proportional to the sine of the phase shift; thus, the modified phase shift signal "sin $\phi$" via the functional block 'arcsin(•)'.

The complete phase shifter, together with the rest of the controller, is shown in FIG. 6. Because of the squaring blocks 534 and 536 of FIG. 5, there are in general two values of $I_{LO}$ that would satisfy the control loop. The sign of the incremental gain around the loop is positive for one solution and negative for the other. The comparator 622 in FIG. 6 ensures stability by switching the sign of the loop gain based on the current value of $I_{LO}$.

The switches on the integrators 226 (also in FIG. 2) and 512 (also in FIG. 5), are included purely for facilitation of testing purposes. These "3-mode integrators" allow the outputs of the integrators to be held at their last value, to be manually adjusted with potentiometers, or to operate normally as integrators. In various commercial implementations, the switches on these integrators are eliminated or designed to be switched automatically as part of a built-in system test (BIST) circuit. The controller of FIG. 6 represents a straightforward mapping from FIGS. 2 and 5 to operational-amplifier building blocks. The integrator 226 is shown in each of FIGS. 2 and 5 using the same connotation. The squaring blocks 534 and 536 of FIG. 5 are respectively depicted in FIG. 6 as multipliers 631 and 633.

The modulator 526 corresponds to the operational-amplifier circuit 640 and the summing resistor set 641. An operational-amplifier circuit 642 provides the reference (voltage) signal to one of the inputs of the operational-amplifier circuit 640 and the summing resistor set 641 provides the sum of the squared signal as output from the multipliers 631 and 633, to the other input of the operational-amplifier circuit 640.

The ability to accurately regulate the phase alignment depends on the ability to calculate IQ'–QI' accurately. As shown in FIG. 6, IQ'–QI' is calculated using multipliers 630 and 632 for QI' and IQ', respectively, and operational-amplifier circuit (or comparator) 622 for computing the difference. For other applications and implementations, a digital signal processor is programmed to compute such multiplication functions.

DC offsets associated with the analog functional blocks can be troublesome. DC offsets manifest at the outputs of many analog functional blocks, such as multipliers, adders and amplifiers, due to their non-ideal behavior. As a specific example, when a zero-level input is presented as an input, the analog functional block outputs a steady-state non-zero constant value that cannot be known a priori. Consequently, using such analog functional blocks in the phase error calculation causes inaccuracies in the phase-error measurement.

In FIG. 6, the output buffers of the multipliers and the input of the integrator 226 carry such DC offsets. Consider an input-referred offset of a for the controller integrator 226, and its effect on the final alignment. This offset can be expressed as:

$$\frac{d\theta}{dt} = G[-k[r(t)]^2 \sin(\Delta\theta) + \delta] = 0.$$

Trimming the output offsets of the analog multipliers 630–633 (e.g., AD835 from Analog Devices) can be accomplished simply using an appropriately-trimmed potentiometer connected to the summing input of one of the multipliers.

In one particular example implementation, k is approximately 1.3 V$^{-1}$. For a symbol magnitude of 50 mV, the offset expression can be solved to provide a result within a 5-degree final misalignment:

$$\delta = (1.3V^{-1})(50mV)^2 \sin\left(\frac{2\pi(5)}{360}\right) = 283\mu V.$$

This example illustrates one of the major challenges that the analog multipliers introduce: offsets become increasingly intrusive as symbol magnitudes decrease. A 5-degree misalignment for a symbol magnitude of a volt leads to a δ of 113 mV; and for a symbol magnitude of 1 mV, this misalignment leads to a δ of 0.113 µV.

Mitigating this effect is the fact the controller slows for smaller signals. Until offsets dominate, $$\left|\frac{d\theta}{dt}\right|$$

scales linearly with $[r(t)]^2$. These numbers nevertheless suggest that, in some implementations, it may be helpful or necessary to prescale the inputs of the multipliers according to the known symbol magnitudes.

In various implementations, the bandwidth of the operational-amplifier subtractor (e.g., 622 of FIG. 6) can be a limitation as well. This is not always the case, however, especially in a monolithic implementation where accurate subtraction in the current domain is trivially implemented. It will be appreciated that many multiplier topologies provide output in the form of currents.

In one implementation consistent with the circuit shown in FIG. 6 for a 250 MHz RF system, using an additional phase shifter in the control path to simulate drift normally present due to temperature and aging, as expected, the results were excellent with the circuit automatically and continuously compensating for misalignments as large as ±88 degrees. Moreover, alignment to within 3.8 degrees can be maintained over this entire range of disturbances.

Figure 7:
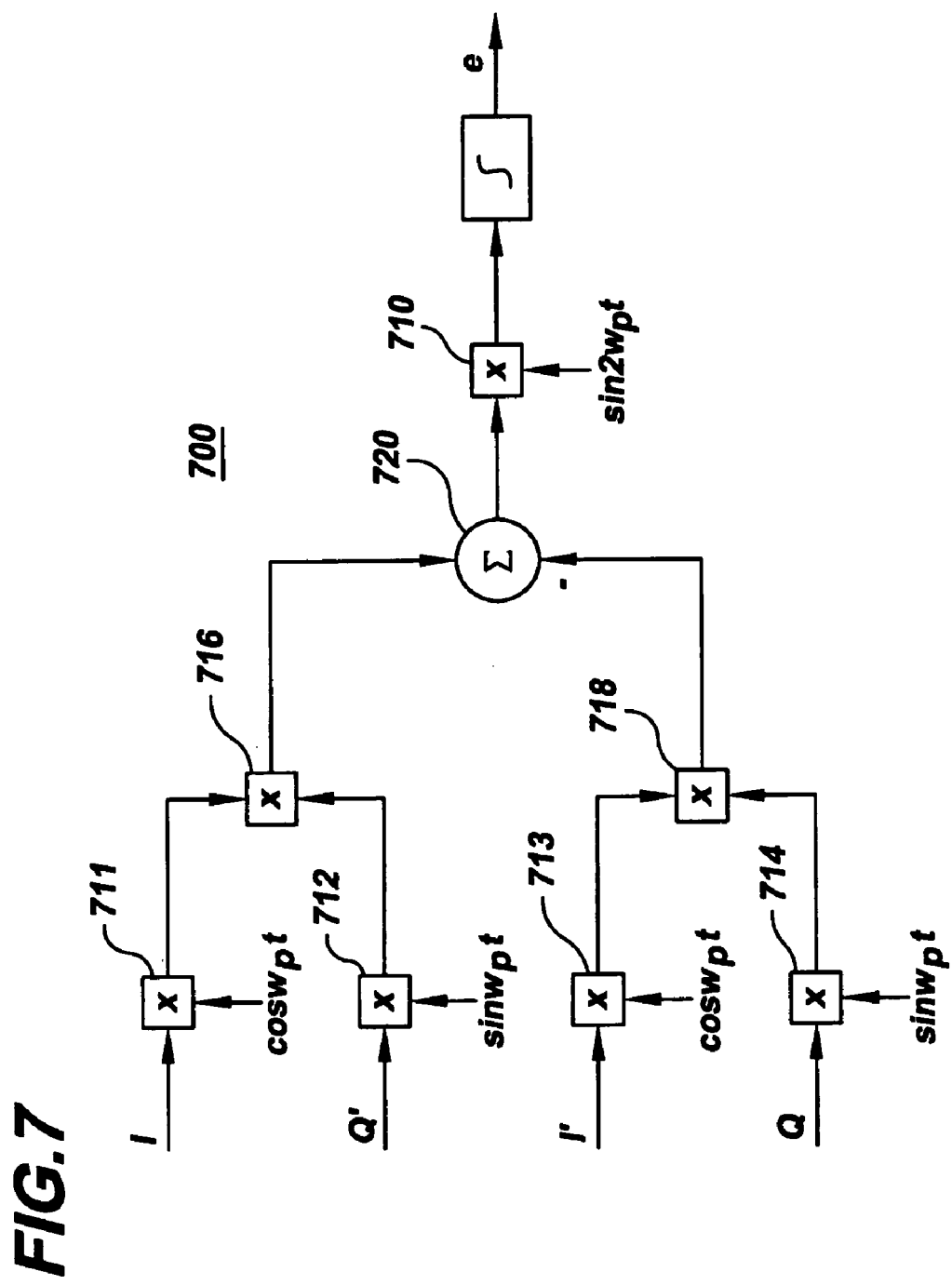
FIG. 7 is a block diagram of a phase-error determination circuit, according to another example embodiment of the present invention.

FIG. 7 illustrates another approach that can be used to provide phase error calculation for the above-described Cartesian feedback systems in a manner that overcomes such DC-offset interference. Circuit 700 includes a multiplier 710 that outputs the desired phase-error information in its expected place in the frequency spectrum, i.e., centered about DC or zero frequency. This output is a function of other analog functional blocks including quadrature-signal multipliers 711–714, multipliers 716 and 718 and subtractor 720. As discussed in connection with FIGS. 5 and 6, each of these analog functional blocks is typically implemented using operational-amplifier circuits. Signal-contaminating artifacts introduced at the outputs of these analog functional blocks are modulated up to either $\omega_p$ or $2\omega_p$ as indicated at the vertically-oriented inputs to the respective multipliers 711–714, 716, 718 and 720, where ωp is the frequency of modulation. These signal-contaminating artifacts are then readily removed by the integrator, or, if necessary, by other standard analog filters.

In accordance with the present invention, this technique of removing artifacts introduced by DC-offset interference is not limited to Cartesian feedback systems, but rather is applicable to a wide variety of circuits including, among others, analog multipliers.

Accordingly, where the inability to continuously regulate phase alignment has been a major barrier to the widespread use of Cartesian feedback as a linearization technique, implementations of the present invention can lower this barrier considerably, thereby facilitating the ability to build Cartesian feedback systems that operate maintenance-free in a hostile environment.

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. Such modifications and changes do not depart from the true spirit and scope of the present invention that is set forth in the following claims.

What is claimed is:

1. A phase-alignment system including phase-alignment circuit for quadrature-phase components of a baseband signal, the phase-alignment circuit including a feed-back signal path providing feedback quadrature-phase components, the phase-alignment circuit comprising:
    an arithmetic circuit adapted to arithmetically combine each of the quadrature-phase components with each of the feedback components; and
    a phase adjustment circuit adapted to provide phase adjustment to the feed-forward signal path, wherein the arithmetic circuit is adapted to arithmetically combine the quadrature-phase components and the feedback components as a function of a phase error equal to $I*Q'-Q*I'$, where I and Q are the quadrature-phase components and Q' and I' are the feedback components, and wherein the arithmetically combined components drive the phase alignment system.

2. A phase-alignment system including phase-alignment circuit for quadrature-phase components of a baseband signal, the phase-alignment circuit including a feed-back signal path providing feedback quadrature-phase components, the phase-alignment circuit comprising:
    an arithmetic circuit adapted to arithmetically combine each of the quadrature-phase components with each of the feedback components; and
    a phase adjustment circuit adapted to provide phase adjustment to the feed-forward signal path, wherein the arithmetic circuit is an analog circuit that is adapted to arithmetically combine the quadrature-phase components and the feedback components by subtracting $Q*I'$ from $I*Q'$, where I and Q are the quadrature-phase components and Q' and I' are the feedback components, and wherein the arithmetically combined components drive the phase alignment system.

3. A phase-alignment circuit for quadrature-phase components of a baseband signal, the phase-alignment circuit including a feed-back signal path providing feedback quadrature-phase components, the phase-alignment circuit comprising:
    an arithmetic circuit adapted to arithmetically combine each of the quadrature-phase components with each of the feedback components; and
    a phase adjustment circuit adapted to provide phase adjustment to the feed-forward signal path, wherein the arithmetic circuit includes digital circuitry adapted to arithmetically combine the quadrature-phase components and the feedback components as a function of a phase error equal to $I*Q'-Q*I'$, where I and Q are the quadrature-phase components and Q' and I' are the feedback components.

4. A phase-alignment circuit for quadrature-phase components of a baseband signal, the phase-alignment circuit including a feed-back signal path providing feedback quadrature-phase components, the phase-alignment circuit comprising:
    an arithmetic circuit adapted to arithmetically combine each of the quadrature-phase components with each of the feedback components; and
    a phase adjustment circuit adapted to provide phase adjustment to the feed-forward signal path, wherein the arithmetic circuit includes analog circuitry adapted to arithmetically combine the quadrature-phase components and the feedback components as a function of a phase error equal to $I*Q'-Q*I'$, where I and Q are the quadrature-phase components and Q' and I' are the feedback components.

5. A phase-alignment circuit for quadrature-phase components of a baseband signal, the phase-alignment circuit including a feed-back signal path providing feedback quadrature-phase components, the phase-alignment circuit comprising:
    an arithmetic circuit adapted to arithmetically combine each of the quadrature-phase components with each of the feedback components; and
    a phase adjustment circuit adapted to provide phase adjustment to the feed-forward signal path continuously, wherein the arithmetic circuit is adapted to arithmetically combine the quadrature-phase components and the feedback components by subtracting $Q*I'$ from $I*Q'$, where I and Q are the quadrature-phase components and Q' and I' are the feedback components.

6. The phase-alignment circuit of claim 5, wherein neither the arithmetic circuit nor the phase adjustment circuit is realized using a programmable digital-signal processing circuit.

7. A phase-alignment circuit arrangement for phase-aligning quadrature-phase components of a baseband signal, comprising:
    means for providing feedback components; and
    means for arithmetically combining each of the quadrature-phase components with each of the feedback components and, in response, for phase-adjusting the feed-forward signal path.

8. A method for phase-aligning quadrature-phase components of a baseband signal in a circuit having a feed-forward signal path, comprising:
    providing quadrature-phase feedback components; and
    arithmetically combining each of the quadrature-phase components with each of the feedback components and, in response, phase-adjusting the feed-forward signal path, wherein arithmetically combining includes subtracting $Q*I'$ from $I*Q'$, where I and Q are the quadrature-phase components and Q' and I' are the feedback components.

9. A circuit for combining quadrature-phase components of a signal, comprising:
    first circuitry including analog circuitry that introduces a DC offset in signals output by the analog circuitry and including modulation circuitry adapted to modulate the quadrature-phase components and further including a plurality of multiplier circuits, each of the multiplier circuits having a pair of inputs and each of the inputs adapted to receive a unique one of the modulated quadrature-phase components, the first circuitry outputting a modulated signal that includes the quadrature-phase components and signal-contaminating artifacts caused by the DC offset; and
    filtering circuitry adapted to process the modulated signal while filtering out the signal-contaminating artifacts.

10. The circuit of claim 9, wherein the first circuitry includes four multiplier circuits, each of the multiplier circuits adapted to modulate a respective one of the quadrature-phase components.

11. The circuit of claim 9, wherein the first circuitry further includes a subtraction circuit adapted to combine signals output from two of the multiplier circuits.

12. The circuit of claim 11, wherein the first circuitry further includes another multiplier circuit adapted to modulate a signal output from the subtraction circuit.

13. An arrangement for phase-aligning quadrature-phase components of a baseband signal, comprising:

providing quadrature-phase feedback components; and a circuit adapted to arithmetically combine each of the quadrature-phase components with each of the feedback components and, in response, phase-adjust the signal, the circuit including circuitry adapted to modulate the quadrature-phase components and to filter out signal-contaminating artifacts introduced by DC offsets;

wherein the circuit includes a first arithmetic logic circuit to combine one of the quadrature-phase components of a first type with one of the feedback quadrature-phase components of a second type, one of the types referring to an in-phase component and the other type referring to an out-of-phase component.

14. An arrangement for phase-aligning quadrature-phase components of a baseband signal, comprising:

providing quadrature-phase feedback components; and a circuit adapted to arithmetically combine each of the quadrature-phase components with each of the feedback components and, in response, phase-adjust the signal, the circuit including circuitry adapted to modulate the quadrature-phase components and to filter out signal-contaminating artifacts introduced by DC offsets;

wherein the arithmetic circuit includes a first arithmetic logic circuit to combine one of the quadrature-phase components of a first type with one of the feedback quadrature-phase components of a second type, one of the types referring to an in-phase component and the other type referring to an out-of-phase component, and includes a second arithmetic logic circuit to combine the other of the quadrature-phase components with the other of the feedback quadrature-phase components.

* * * * *

UNITED STATES PATENT AND TRADEMARK OFFICE
CERTIFICATE OF CORRECTION

PATENT NO. : 7,177,366 B1  
APPLICATION NO. : 09/947624  
DATED : February 13, 2007  
INVENTOR(S) : Dawson et al.

Page 1 of 1

It is certified that error appears in the above-identified patent and that said Letters Patent is hereby corrected as shown below:

Col. 1, line 16: "lead" should read --led--.

Col. 1, line 23: "is also diverse and including" should read --are also diverse and include--.

Col. 1, line 27: "used" should read --use--.

Col. 2, line 17: "regularly" should read --regular--.

Col. 2, line 32: "signals" should read --signal--.

Col. 7, line 49: "a" should read --δ--.

Signed and Sealed this

Ninth Day of September, 2008

JON W. DUDAS  
*Director of the United States Patent and Trademark Office*